United States Patent
Liu et al.

(10) Patent No.: US 9,577,592 B2
(45) Date of Patent: Feb. 21, 2017

(54) METHOD AND DEVICE FOR CONTROLLING A POWER AMPLIFIER CONFIGURED TO USE NONLINEARITY CORRECTION AND A POWER AMPLIFIER SYSTEM

(71) Applicant: Telefonaktiebolaget L M Ericsson (publ), Stockholm (SE)

(72) Inventors: Lei Liu, Chengdu Sichuan (CN); Linsheng Liu, Sichuan (CN); Fan He, Sichuan (CN); Wenjun Feng, Sichuan (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/769,214

(22) PCT Filed: Feb. 22, 2013

(86) PCT No.: PCT/CN2013/071792
§ 371 (c)(1),
(2) Date: Aug. 20, 2015

(87) PCT Pub. No.: WO2014/127534
PCT Pub. Date: Aug. 28, 2014

(65) Prior Publication Data
US 2016/0006404 A1 Jan. 7, 2016

(51) Int. Cl.
*H03F 3/21* (2006.01)
*H03F 1/02* (2006.01)
(Continued)

(52) U.S. Cl.
CPC ............ *H03F 3/21* (2013.01); *H03F 1/0261* (2013.01); *H03F 1/30* (2013.01); *H03F 1/3247* (2013.01);
(Continued)

(58) Field of Classification Search
CPC . H03F 1/00; H03F 1/0261; H03F 1/14; H03F 1/30; H03F 1/324; H03F 3/04;
(Continued)

(56) References Cited

U.S. PATENT DOCUMENTS 6,614,309 B1 * 9/2003 Pehlke .................... H03F 1/025
330/296
6,917,246 B2 7/2005 Thompson
(Continued)

FOREIGN PATENT DOCUMENTS

| CN | 1841971 A | 10/2006 |
| CN | 1905356 A | 1/2007 |
| CN | 102640415 A | 8/2012 |

*Primary Examiner* — Shawkat M Ali
(74) *Attorney, Agent, or Firm* — Murphy, Bilak & Homiller, PLLC

(57) ABSTRACT

There is disclosed a method for controlling a power amplifier capable of utilizing nonlinearity correction in a nearly steady operation status of non-linearity correction, in a periodical fast switching system in time domain. The method may comprise receiving a periodic switch signal indicating switch time of the periodical fast switching system; and providing, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor.

21 Claims, 10 Drawing Sheets

(51) Int. Cl.
*H03F 1/30* (2006.01)
*H03F 1/32* (2006.01)
*H03F 3/195* (2006.01)
*H03F 3/24* (2006.01)
*H03F 3/72* (2006.01)

(52) U.S. Cl.
CPC .......... *H03F 1/3258* (2013.01); *H03F 3/195* (2013.01); *H03F 3/245* (2013.01); *H03F 3/72* (2013.01); *H03F 2203/7206* (2013.01)

(58) Field of Classification Search
CPC . H03F 3/18; H03F 3/21; H03F 1/3247; H03F 2203/7206; H03F 3/72; H03G 3/10; H03M 1/12; H04B 1/04; H04L 25/49; H04L 27/36
USPC ......... 330/51, 133, 151, 285, 289, 295, 296, 330/310; 375/295–298
See application file for complete search history.

(56) References Cited

U.S. PATENT DOCUMENTS

| | | | |
|---|---|---|---|
| 7,768,353 B2* | 8/2010 | Chang | H03F 1/0272 330/133 |
| 8,023,588 B1 | 9/2011 | Benson et al. | |
| 8,554,161 B2* | 10/2013 | Alon | H03F 1/0261 455/127.1 |
| 8,594,233 B2* | 11/2013 | Muhammad | H04L 27/361 375/259 |
| 8,824,978 B2* | 9/2014 | Briffa | H03F 1/32 330/124 R |
| 2003/0107434 A1* | 6/2003 | Mitzlaff | H03F 1/0222 330/149 |
| 2004/0100323 A1* | 5/2004 | Khanifar | H03F 1/0244 330/51 |
| 2005/0191976 A1* | 9/2005 | Shakeshaft | H03C 3/40 455/118 |
| 2006/0133536 A1* | 6/2006 | Rexberg | H03F 1/3258 375/297 |
| 2007/0146090 A1* | 6/2007 | Carey | H03C 5/00 332/112 |
| 2007/0184795 A1* | 8/2007 | Drogi | H03F 1/0205 455/127.1 |
| 2010/0020899 A1* | 1/2010 | Szopko | H03F 1/30 375/297 |
| 2011/0025422 A1 | 2/2011 | Marra et al. | |
| 2012/0149316 A1 | 6/2012 | Firouzkouhi et al. | |
| 2012/0286866 A1 | 11/2012 | Khanifar et al. | |

* cited by examiner

| ACLR | Lower | Upper |
|---|---|---|
| Beginning of 3rd downlink subframe after an uplink time slot(2 subframes after PA turns on) | -60.4 dBc | -58.3 dBc |
| Beginning of 1st downlink subframe after an uplink time slot (i.e., PA just turns on) | -51.8 dBc | -49.9 dBc |
| Deterioration | 8.6 dBc | 8.4 dBc |

METHOD AND DEVICE FOR CONTROLLING A POWER AMPLIFIER CONFIGURED TO USE NONLINEARITY CORRECTION AND A POWER AMPLIFIER SYSTEM

TECHNICAL FIELD

Embodiments of the present disclosure generally relate to wireless communication technologies, and more particularly relate to a method and a device for controlling a power amplifier configured to use nonlinearity correction in a nearly steady operation status of nonlinearity correction in a periodical fast switching system in a time domain that defines downlink time slots (for example, in a Time Division Duplex (TDD) system), and a power amplifier system thereof.

BACKGROUND

As one of duplex technologies, TDD will allow uplink and downlink to share a same frequency band in different time, and thus it requires a periodical fast switching between the uplink and the downlink in time domain so as to realize the duplex. FIG. 1 schematically illustrates a switching between the downlink and the uplink in a TDD system in prior art. As illustrated, an uplink time slot 110 and a downlink time slot 130 will utilize the same frequency band source in different time slots and there is further provided a Guard Period (GP) 120 between the uplink time slot 110 and the downlink time slot 130 to provide a protection in switching.

In a periodical fast switching system in time domain such as a TDD system, to improve a linearity of power amplifier (PA) that is used to amplify the RF signal to be transmitted, nonlinearity correction is widely used. As a typical means of nonlinearity correction, a Digital Pre-distortion (DPD) technology is well-known. The DPD technology enables the PA to trade linearity for efficiency so as to obtain significant power saving, and it has become an important part in modern communication systems.

FIG. 2 schematically illustrates a typical structure of a power amplifier system for using in a TDD system wherein the power amplifier is capable of utilizing nonlinearity correction. As illustrated in FIG. 2, a DPD module 201, which may be implemented by a FGPA, ASIC, etc., performs a DPD correction on an input signal, the signal output from the DPD module 201 will be sent to a Digital to Analog Converter (DAC) 202, which in turn converts digital signal into analog signal. Then, the analog signal will be input into the TX (low level) module 203 so as to convert the baseband signal to an RF signal, the PA 204 will then amplify the RF signal. After that, the amplified signal will be further guided to a filter unit (FU) via a circulator 207 and transmitted via antenna (not shown). On the other hand, the output of the PA is further fed back to the DPD module for using in DPD correction. Specifically, the output of PA is down-converted through a feedback (low level) module 205 and is converted into a digital signal by an Analog to Digital Converter (ADC) 206; the digital feedback signal then will be provided to the DPD module 201, which will calculate the distortion coefficients based on these feedback signals so as to perform DPD correction. Similarly, for receiving side, a signal received by antenna will be filtered by the FU and transmitted to a Low Noise Amplifier (LNA) 208 via circulator 207, and then the amplified signal will be further sent to a receiving portion (RX) for further processing.

Different from frequency division duplex (FDD) system, the TDD system will turn off a quiescent bias voltage of the PA during the uplink time slot so as to further save power and minimize receiver noise, which has become a common means in the TDD system. FIG. 3 schematically illustrates a bias control scheme of a power amplifier in the prior art, wherein it is assumed that the power amplifier comprises a Laterally Diffused Metal Oxide Semiconductor (LDMOS) transistor or an enhancement type transistor. As illustrated, during an uplink time slot, a voltage provided to a gate bias terminal of the PA is set as zero while the voltage is set as a normal bias voltage (i.e., a voltage that causes the transistor in the PA in a biasing condition so as to amplify the input signal as designed) during a downlink time slot. Additionally, there is further provided a protection time before the downlink time slot begins, which means the normal bias voltage has been provided in advance prior to the downlink time slot so as to ensure that the quiescent bias voltage of a power transistor is well turned on when the downlink data comes. However, due to turning off and on the quiescent bias voltage, it may be observed that the linearity performance of the PA changes considerably.

Furthermore, US patent application publication No. 2012/0286866A1 titled "AMPLIFIER PERFORMANCE STABILIZATION THROUGH PREPARATORY PHASE" discloses a method and related systems for amplifier performance stabilization of a digitally pre-distorted RF power amplifier to tackle digital pre-distortion problems during an initial application of an RF signal to a power amplifier or in a PA-DPD's start up process. Before the RF signal is applied to the power amplifier and the digital pre-distortion calculation starts, there is provided a preparatory phase in which a quiescent current of the power amplifier will be increased to a high level beyond nominal values when the operating temperature is less than a predetermined temperature in order to rapidly warm up the completely cold PA.

However, during switching from the uplink time slot to the downlink time slot, it still may observe a notable deterioration in the DPD linearization performance of the PA. This lies in that update rate of the DPD module can not yet match characteristics changes of a transistor in the PA which are resulted from turning off and on the quiescent bias voltages of the PA. In other word, calculated DPD coefficients are not suitable for input signals and the linear relationship of the PA is lost. Therefore, Adjacent Channel Leakage Ratio (ACLR), which may represent the DPD linearization performance of the PA, might be deteriorated remarkably.

Reference is made to FIGS. 4A-4E. FIG. 4A schematically illustrates ACLR values in different frequency ranges at beginning of a first downlink subframe. A frequency range of desired signals is located centrally and has an ACLR value of 46.0 dBm; two frequency ranges lower than the frequency range of desired signals are illustrated located at left side and have ACLR values of −65.8 dBc and −51.8 dBc respectively; and two frequency ranges higher than the frequency range of desired signals are illustrated at right side and respectively have ACLR values of −49.9 dBc and −65.9 dBc. Particularly, ACLR values in the frequency ranges immediately adjacent to the frequency range of desired signals are highlighted by black blocks. FIG. 4B schematically illustrates corresponding signal portion in the first downlink subframe on which the ACLR values as illustrated in FIG. 4A are tested, from which it is clear that it is at beginning of the first downlink subframe after an uplink time slot. FIG. 4C schematically illustrates ACLR values in different frequency ranges at beginning of a third downlink subframe, the frequency ranges are similar to those illustrated in FIG. 4A and respectively have ACLR values of −66.0 dBc, −60.4 dBc, 46 dBm, −58.3 dBc and −65.6 dBc. Moreover, ACLR values in the frequency ranges immediately adjacent to the frequency range of desired signals are also highlighted by black blocks. Similarly, FIG. 4D schematically illustrates corresponding signal portion in the third downlink subframe on which the ACLR values as illustrated in FIG. 4C are tested, and it is clear that it is at beginning of the third downlink subframe.

Besides, FIG. 4E schematically further illustrates a comparison between ACLR values in frequency ranges immediately adjacent to the frequency range of desired signals in the first downlink subframe and in the third downlink subframe, wherein the ACLR values to be compared have been highlighted by black blocks in both FIGS. 4A and 4C. From FIG. 4E, it is clear that, compared to the beginning of the third downlink subframe which may represent a steady status in the downlink time slot (i.e., a status in which both a thermal balance and an electric balance are achieved), the ACLR deteriorates about 8 dB at the beginning of the first downlink subframe (i.e., when the PA is just turned on), and specifically, 8.6 dBc in a lower frequency range and 8.4 dBc in an upper frequency range respectively. This clearly reflects that, in the periodical fast switching system in time domain such as a TDD system, the linearity performance of the PA is degraded at beginning of a downlink time slot.

SUMMARY

In view of the problems as mentioned above, there is a need for a solution for improving the linearization performance of PA in a periodical fast switching system in time domain such as a TDD system. To this end, the present disclosure provides a new solution for controlling a power amplifier capable of utilizing nonlinearity correction so as to obviate or at least partially mitigate at least part of above problems.

In an aspect of the present embodiments, there is provided a method for controlling a power amplifier capable of utilizing nonlinearity correction in a nearly steady operation status of non-linearity correction, in a periodical fast switching system in time domain. The method may comprise receiving a periodic switch signal indicating switch time of the periodical fast switching system; and providing, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor.

In another aspect of the present embodiments, there is further provided a device for controlling a power amplifier capable of utilizing nonlinearity correction in a nearly steady operation status of non-linearity correction, in a periodical fast switching system in time domain. The device may comprise a switch signal receiving unit, configured to receive a periodic switch signal indicating switch time of the periodical fast switching system; and a pre-bias signal providing unit, configured to provide, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor.

In a further aspect of the present embodiments, there is also provided a power amplifier system for using in a periodical fast switching system in time domain. The power amplifier system may comprise a power amplifier for amplifying a RF signal in the periodical fast switching system in time domain; a nonlinearity correction module for performing a nonlinearity correction for the power amplifier; and a device for controlling the power amplifier according to the second aspect of present embodiments.

In a still further aspect of the present embodiments, there is provided an apparatus for controlling a power amplifier capable of utilizing nonlinearity correction in a nearly steady operation status of non-linearity correction, in periodical fast switching system in time domain. The apparatus may comprise an integrated circuit configured to perform the method as recited the first aspect of the present embodiments. In an embodiment of the present disclosure, the integrated circuit may comprise a first circuit component configured to receive a periodic switch signal indicating switch time of the periodical fast switching system; and a second circuit component configured to provide, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor.

In the embodiments of the present disclosure, before the downlink time slot begins, a pre-bias signal for preheating the transistor of the power amplifier will be provided to the power amplifier in advance so as to compensate a temperature change of a die inside the transistor. In such a way, the temperature difference in a die inside the transistor of the power amplifier will be reduced significantly and thus transistor characteristics changes during switching between the uplink time slot and the downlink time slot may be also reduced accordingly. Accordingly, with embodiments of the present disclosure, the linearity performance of the power amplifier may be improved greatly during the steady status of the non-linearity correction at a relative low cost.

Other features and advantages of the embodiments of the present disclosure will also be apparent from the following description of specific embodiments when read in conjunction with the accompanying drawings, which illustrate, by way of example, the principles of embodiments of the invention.

BRIEF DESCRIPTION OF THE DRAWINGS

Embodiments of the invention are presented in the sense of examples and their advantages are explained in greater detail below, with reference to the accompanying drawings throughout which like reference numbers represent same or similar components and wherein.

DETAILED DESCRIPTION OF EMBODIMENTS

Figure 1:
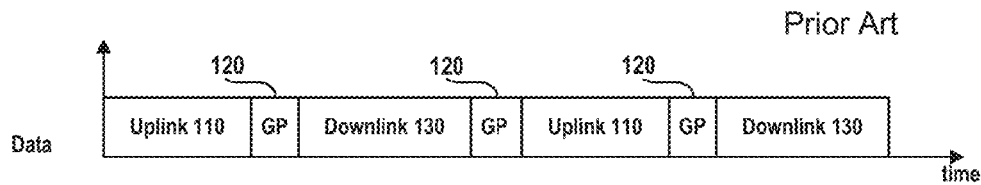
FIG. 1 schematically illustrates a switching between the downlink and the uplink in a TDD system in prior art.

Hereinafter, a method and a device for controlling a power amplifier capable of utilizing nonlinearity correction in a nearly steady operation status of nonlinearity correction in a periodical fast switching system in time domain (such as a TDD system), and a power amplifier system thereof will be described in details through embodiments with reference to the accompanying drawings. It should be appreciated that these embodiments are presented only to enable those skilled in the art to better understand and implement the present disclosure, not intended to limit the scope of the present disclosure in any manner.

In the accompanying drawings, various embodiments of the present disclosure are illustrated in block diagrams, flow charts and other diagrams. Each block in the flowcharts or block diagrams may represent a module, a program, or a part of code, which contains one or more executable instructions for performing specified logic functions. Besides, although these blocks are illustrated in particular sequences for performing steps of the methods, as a matter of fact, they may not necessarily be performed strictly according to the illustrated sequence. For example, they might be performed in reverse sequence or simultaneously, which is dependent on natures of respective operations. It should also be noted that block diagrams and/or each block in the flowcharts may be implemented by a dedicated hardware-based system for performing specified functions/operations or by a combination of dedicated hardware and computer instructions.

Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, unit, step, etc., without excluding a plurality of such devices, components, means, units, steps, etc., unless explicitly stated otherwise.

Next, terms used in the specification will be described so as to facilitate understanding of the present disclosure. In the present disclosure, term "a nearly steady operation status of nonlinearity correction" represents a status wherein the nonlinearity correction module (such as DPD module) has begun its normal operations and the DPD is in an almost steady status, i.e., calculated DPD coefficients are substantially steady and will not changed greatly; or in other word, the PA has begun its normal operation and it enters into in a status in which a temperature sensor will not sense a notable temperature change of the PA in a short time. However, in the nearly steady status, there might be still temperature variations of a die inside transistor of the PA, which can not be sensed by a temperature sensor. Additionally, in the present disclosure, there are defined four different statuses for the transistor of PA, i.e., quiescent status, working status, transition status and steady status. The quiescent status denotes a status wherein the gate biasing is on but without an input signal; the working status denotes a status wherein the gate biasing is on with an input signal; the transition status denotes a status wherein the gate biasing is on with an input signal but it has not achieved an electrical and thermal balance; and the steady status denotes a status wherein the gate biasing is on with an input signal and it has achieved the electrical and thermal balance.

Hereinafter, the basic principle of the present invention will be given first so as to facilitate understanding of the present invention.

As is mentioned in background, in the nearly steady operation status, it may be still found a notable linearity performance deterioration of the PA during an uplink to downlink transition period. This performance deterioration is mainly induced by nonlinearities of the RF power transistors in the PA during the switching, which might bring about, for example, unwanted emission to the standard test and results in the failure of error vector magnitude (EVM) test. Therefore, it is a critical issue to improve the linearity performance of the power amplifier capable of utilizing nonlinearity correction during the uplink to downlink transition period.

To solve the linearity performance deterioration problem, the inventors have made a lot of researches and noticed that the deterioration is mainly related to physical properties of the transistor, and more particularly, physical properties of a die inside the transistor of PA. Specifically, electrical status and thermal status (such as temperature) of the die inside the transistor are dependent on the bias voltage provided thereto and its status (which may be any one of quiescent status, working status, transition status and steady status). Therefore, difference in electrical statuses (such as gain, efficiency and power of the transistor) when the gate biasing is on and when the gate biasing is off is rather obvious. In addition, the quiescent biasing will lead to a quiescent current which may convert to heat dissipation and make temperature different of the transistor from that when the gate biasing is off. Furthermore, the transistor will also generate different heat dissipations under different status, which makes thermal analysis complicated and in turn results in difficulties in modeling of electro-thermal behaviors of the transistor during the gate biasing on/off.

Additionally, the inventors have also realized that characteristics changes of the transistor between quiescent status and working status, especially those changes due to the temperature changing of the die inside the transistor, cause the mismatched DPD coefficients, which is a main reason of this linearity performance deterioration.

The inventors have further realized that one of possible solutions is to increase the update rate of the DPD module so as to obtain proper coefficients suitable for each DPD update cycle or DPD convergence. Theoretically, if the update rate is high enough, the characteristics variation of the transistor in each DPD update cycle may be sampled and modeled accurately using the DPD module. However, the solution will significantly increase algorithm complexity of the DPD module and cost of hardware resources since it requires costly hardware for high speed sampling and for high speed data computing and it also requires calculating DPD coefficients at a high rates. Moreover, actually, it is hard to obtain these hardware resources by means of current technologies.

Hence, there is a need to find a new solution for improving the linearity performance of the PA. According to the thermal theory, a temperature of a junction (i.e., a die inside the transistor) can be represented as $$T_j = \Delta T_{jc} + T_c = P \cdot R_{jc} + T_c \quad \text{(Formula 1)}$$

wherein $T_j$ denotes junction temperature (or die temperature) of the transistor, $T_c$ denotes case temperature of the transistor; $\Delta T_{jc}$ denotes differential temperature between the junction and the case of the transistor; P denotes heat dissipated power of the junction; and $R_{jc}$ denotes thermal resistance from the junction to the transistor case, which is a constant decided by manufacture techniques of the transistor. From the above Formula 1, it may be seen that a higher heat dissipated power will lead a higher junction temperature under a same case temperature.

The heat dissipated power under a quiescent status can be represented by:

$$P = V_{DD} \cdot I_{quiescent} \quad \text{(Formula 2)}$$

wherein $V_{DD}$ is a power supply voltage and $I_{quiescent}$ is a quiescent current. Therefore, a higher gate bias voltage will lead to a higher quiescent current.

Additionally, the inventors find that there is another important parameter, i.e., heat capacity, which may be denoted by $C_{thermal}$. Accordingly, a time constant $\tau_{thermal}$ which represents time to achieve a thermal balance may be represented as $$\tau_{thermal} = R_{thermal} \cdot C_{thermal} \quad \text{(Formula 3)}$$

wherein $R_{thermal}$ denotes a thermal resistance.

In view of the fact that the heat capacity of the transistor case is large enough so that a time constant of the transistor case is much higher than the TDD frame time, a temperature change of the transistor case in a TDD frame is very small and thus may be ignored. However, the heat capacity of the junction is so small and the corresponding time constant is comparable to the TDD frame time, and thus the junction temperature variation should be considered and can not be ignored. Therefore, the time constant of the junction, which may be denoted by $\tau_j$, can be described as:

$$\tau_j = R_{jc} \cdot C_j \quad \text{(Formula 4)}$$

wherein $C_j$ denotes a thermal capacity of the junction.

Figure 4A:
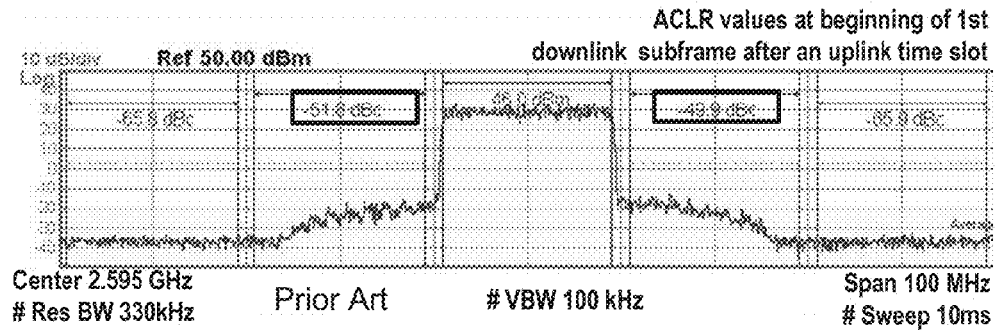
FIG. 4A schematically illustrates ACLR values in different frequency ranges at beginning of a first downlink time slot in the prior art.
Figure 4B:
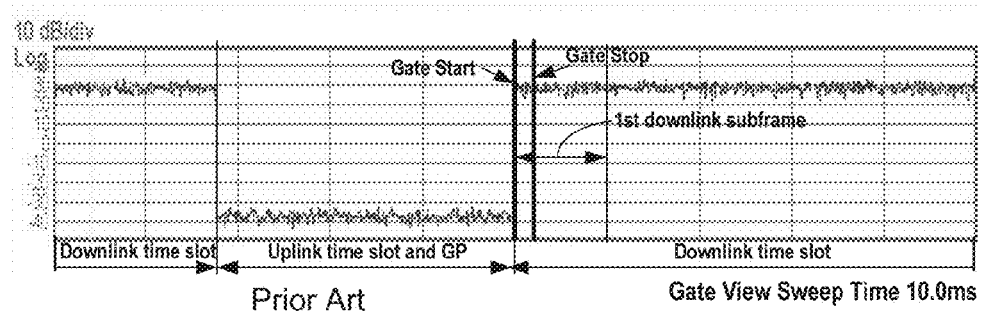
FIG. 4B schematically illustrates corresponding signal portion in the first downlink subframe on which the ACLR values as illustrated in FIG. 4A are tested.
Figure 4C:
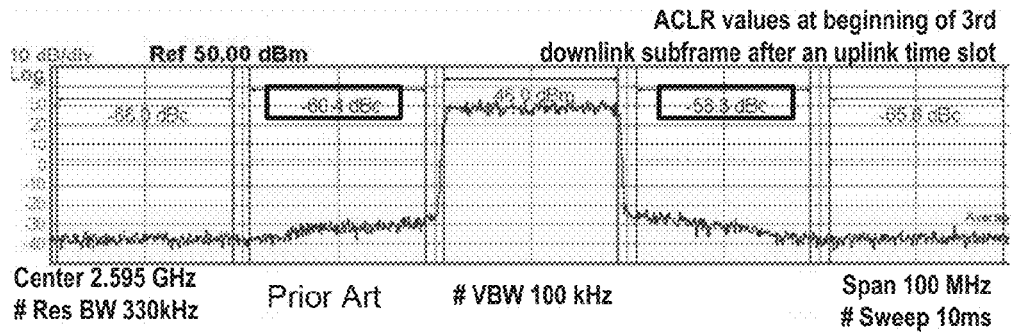
FIG. 4C schematically illustrates ACLR values in different frequency ranges at beginning of a third downlink time slot in the prior art.
Figure 4D:
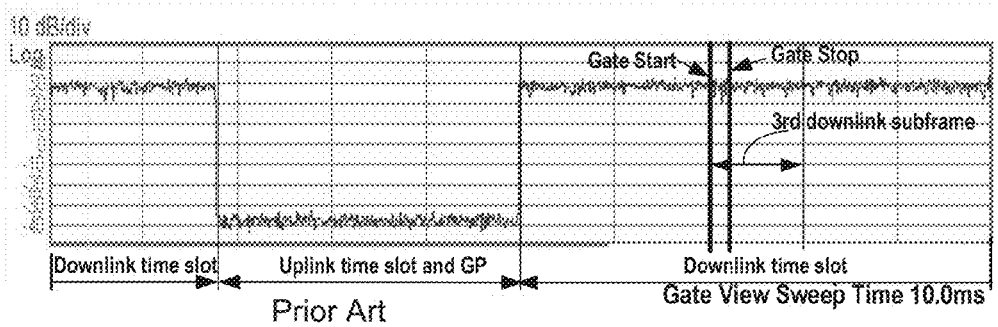
FIG. 4D schematically illustrates corresponding signal portion in the third downlink subframe on which the ACLR values as illustrated in FIG. 4C are tested.
Figures 4E, 5:
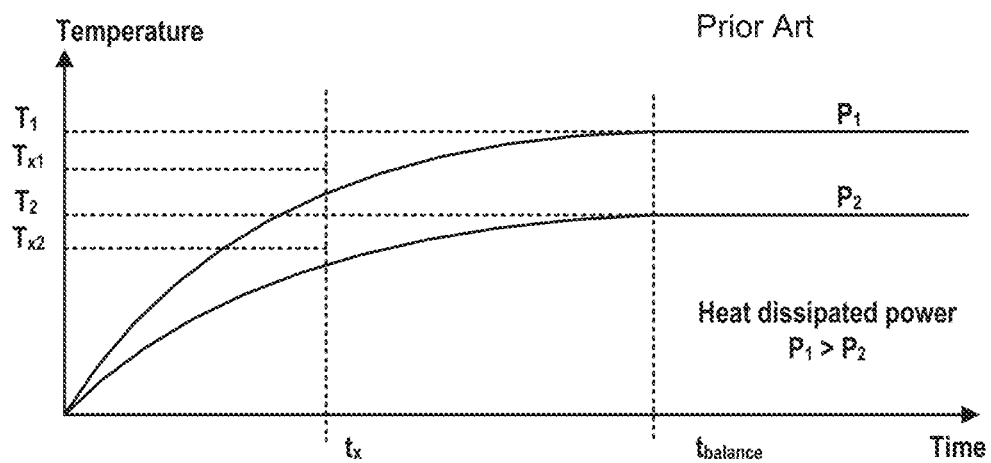
FIG. 4E schematically illustrates a comparison between ACLR values in concerned frequency ranges.
FIG. 5 schematically illustrates a temperature variation with different heat dissipated power.

From Formula 4, it is clear that this time constant $\tau_j$ has no concern with the heat dissipated power and thus under the same case temperature, the time that the die achieves a thermal balance with a higher heat dissipated power is identical to the time that it achieves a thermal equilibrium with a lower heat dissipated power. FIG. 5 schematically illustrates the junction temperature variation with different heat dissipated power, from which, it can be seen that for different heat dissipated power, the time that a die achieve a thermal balance is identical but a higher heat dissipated power may accelerate a temperature increasing.

In view of the above, there is provided a new solution for improving the linearity performance of the PA. In the following, detailed description will be made to this solution with reference to FIGS. 6 to 18 by taking a TDD system as an example. However, it should be appreciated that the present disclosure is not limited thereto and the solution as disclosed in the present disclosure may be also applicable to other periodical fast switching system in time domain.

Figure 6:
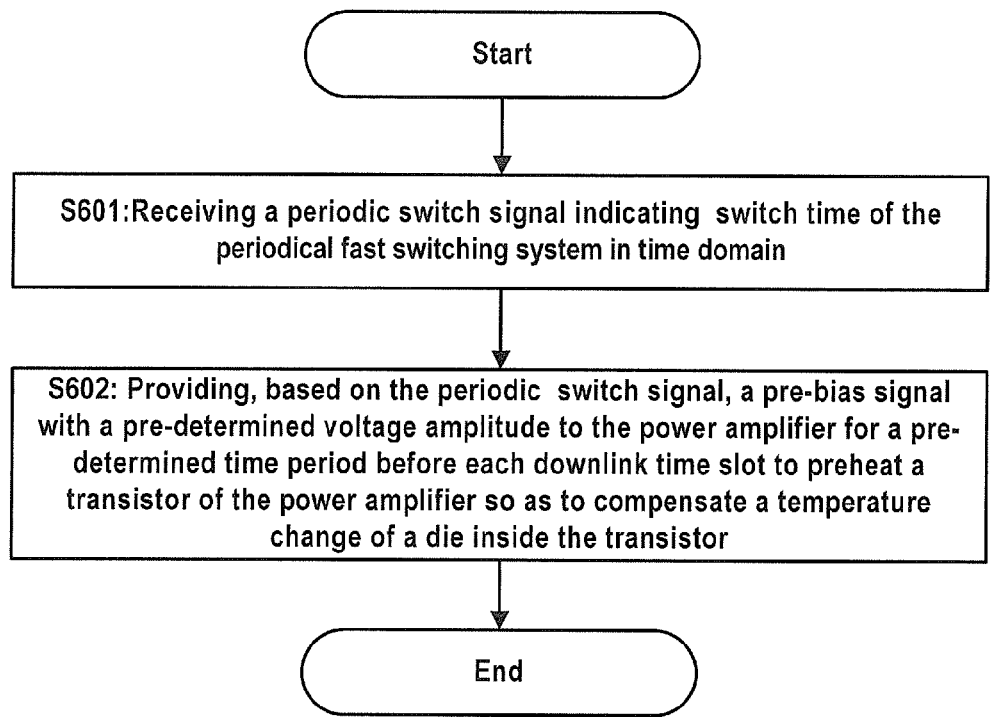
FIG. 6 schematically illustrates a flow chart of a method for controlling a power amplifier according to an embodiment of the present disclosure.

Reference is first made to FIG. 6 to describe a method for controlling a power amplifier according to an embodiment of the present disclosure.

As illustrated in FIG. 6, first at step S601, a periodic switch signal that indicates switch time of the periodical fast switching system in time domain is received.

The periodic switch signal is a periodic signal that indicates the switch time of the periodical fast switching system. For example, in TDD, the periodic switch signal may be a periodic TDD uplink/downlink switch signal indicating switch time between the uplink and the downlink. In the TDD system, the periodic TDD uplink/downlink switch signal may be generated based on information contained in a special subframe of a baseband signal. Generally, the special subframe contains TDD synchronization information, such as time reference information, the frame structure from which it may determined time lengths of the uplink time slot, the GP and the downlink time slot, and so on. Therefore, the TDD synchronization information may be extracted from the special subframe by for example a baseband signal processing apparatus. Next, this TDD synchronization information may be sent to for example an FPGA or ASIC. The FPFA or ASIC, particularly a switch signal generator (or any other suitable module) may generate a periodic TDD uplink/downlink switch signal based on the extracted TDD synchronization information. Based on the time lengths of the uplink time slot, the GP and the downlink time slot, it may determine a relative switch time with respect to for example beginning of the uplink time slot and the real switch time may determined from the relative switch time and the time reference information and in turn a periodic TDD uplink/downlink switch signal may be generated. This periodic TDD uplink/downlink switch signal can be in any form as long as it can indicate the uplink/downlink switch time. For example, it may use a low level (for example "0") to indicate the uplink time slot, use a high level (for example "1") to indicate the downlink time slot and use a falling edge to denote the uplink/downlink switch time point, and vice versa. It should be appreciated that, for other periodical fast switching systems, the periodic switch signal may be generated in a similar way to the above means by which the periodic TDD uplink/downlink switch signal is generated.

Then at step S602, based on the periodic switch signal, a pre-bias signal with a pre-determined voltage amplitude is provided to the power amplifier for a pre-determined time period before each downlink time slot to preheat a transistor of the power amplifier, so as to compensate a temperature change of a die inside the transistor.

That is to say, in embodiments of the present disclosure, the gate biasing time may comprise two portions, i.e., a pre-bias time (i.e., the predetermined time period for providing the pre-bias signal) and a normal bias time (i.e., a time period for providing a normal bias voltage). In a context of the present disclosure, the normal bias voltage is a voltage provided to the gate bias terminal of the PA so that the PA, specifically the transistor in the PA, is in a biasing condition so as to amplify the input signal. Generally, the normal bias voltage is dependent on type of the transistor inside the PA (for example, it may be 1.89V). The pre-bias signal means a signal provided to the gate bias terminal of the PA in advance before the downlink time slot begins, which is used to preheat a transistor of the power amplifier, which may have a voltage amplitude equal to or different from the normal bias voltage.

The pre-determined voltage amplitude of the pre-bias signal and the predetermined time period may be selected from a plurality of pre-determined time periods and pre-determined voltage amplitudes of the pre-bias signal based on current system configurations. The plurality of pre-determined time periods and pre-determined voltage amplitudes are determined for different system configurations in advance, which may be described hereinafter. The time point that begins to provide the pre-bias signal may be determined based on the predetermined time period and the switch time between the uplink and the downlink. Thus, based on the periodic switch signal (for example, the periodic TDD uplink/downlink switch signal in the TDD system), it may provide the desired pre-bias signal. In an embodiment of the present disclosure, a waveform of the pre-bias signal may be generated based on the periodic switch signal by a waveform generator. The waveform generator may generate a pre-bias signal in real-time based on waveform parameters such as shape and amplitude of the pre-bias signal, the pre-bias time and the periodic switch signal, and it may be implemented by an FPGA, ASIC or any other appropriate means. Or alternatively, there may be provided a waveform storage unit for storing waveforms of the pre-bias signal and providing a waveform of the pre-bias signal based on the periodic switch signal. The waveform storage unit may comprise a non-volatile memory or a device including such a memory so as to store waveforms of the pre-bias signal.

Figure 7:
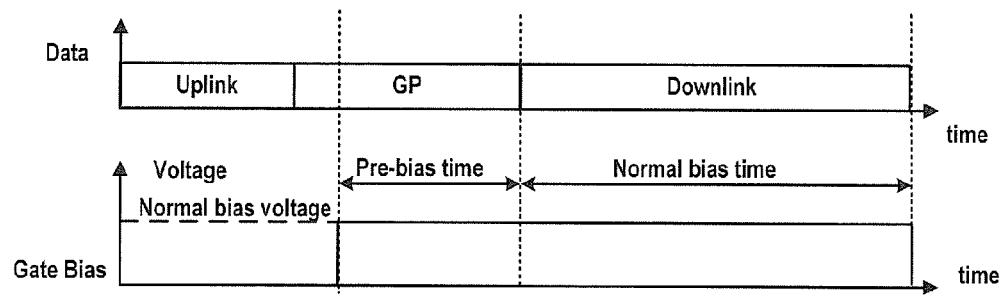
FIG. 7 schematically illustrates an exemplary gate bias control according to an embodiment of the present disclosure.

Next, reference is made to FIG. 7, which illustrates an exemplary gate bias control according to an embodiment of the present disclosure and wherein the pre-bias signal is in a form of rectangle wave with an amplitude equal to the normal bias voltage. As illustrated, first, a pre-bias voltage, which is equal to the normal bias voltage, is provided and this time point that begins to provide the pre-bias voltage is well before a downlink time slot, and when the downlink time slot comes, the normal bias voltage is maintained until the downlink time slot ends.

In such a way, temperature of the transistor of the PA may be increased in advance, which may reduce or even eliminate the temperature difference of the die between the transition status and the steady status and in turn improve the linearity performance of the PA in the transition status. Compared to a solution wherein a protect time is used, the pre-bias signal is directed to preheat the transistor and thus the pre-bias time for providing the pre-bias signal is much longer. In this embodiment of the present disclosure, a pre-bias time, during which the pre-bias signal is provided, is illustrated as less than the time length of GP. However, it is also possible to extend the pre-bias time even beyond the GP, for example it may begin to provide the pre-bias signal during the uplink time slot, at beginning of the uplink time slot or even more earlier, as long as the system allows to do this, or it may provide appropriate means to eliminate adverse effects (such as noises) that may be caused. However, it may be noticed that the pre-bias time for providing the pre-bias signal can not be extended into the previous downlink time slot in any case, which means the pre-bias time for preheating the transistor is limited and in turn the effect of the pre-bias solution as proposed in FIG. 7 may be limited by the pre-bias time.

Figure 8:
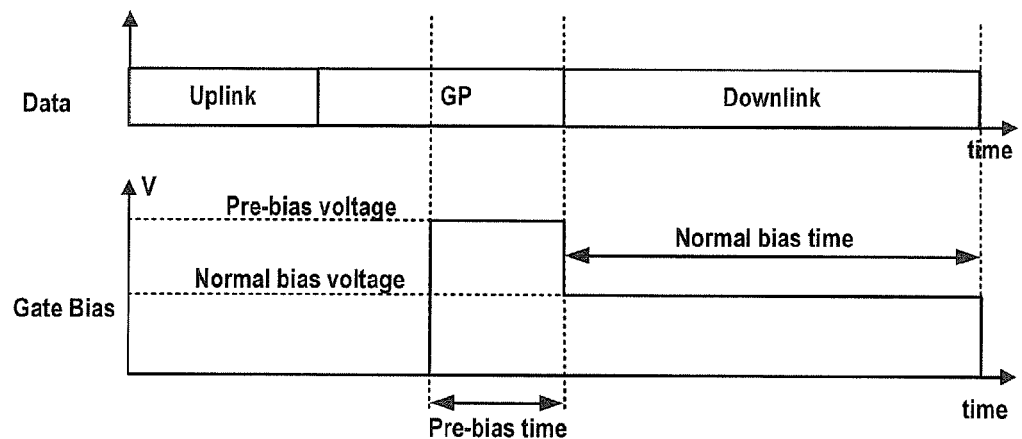
FIG. 8 schematically illustrates another exemplary gate bias control according to an embodiment of the present disclosure.

In FIG. 8, there is provided another exemplary gate bias control according to an embodiment of the present disclosure. As illustrated, the pre-bias signal is in a form of a rectangle wave and its amplitude is higher than the normal bias voltage, and the voltage provided to the gate bias terminal of the transistor is adjusted back to the normal bias voltage once the downlink time slot comes.

In terms of electric status, a higher pre-bias voltage may create more intensive gate electric field and the carrier will move faster. Thus, it will take shorter time to reach the same electric status by using the higher pre-bias voltage. Hence, the pre-bias voltage may not only turn on the transistor in advance but also reduces the time to reach a steady electric status.

On the other hand, a higher pre-bias voltage will lead to a higher quiescent drain current of transistor, and the power consumption of this quiescent current will be all dissipated as heat. Therefore, with the same heat sink, the higher pre-bias voltage will lead to more heat, a faster temperature increase and a higher temperature of transistor.

Accordingly, by using a higher pre-bias voltage, it is also much easier to make a temperature of the transistor at beginning of each downlink time slot approximate to that in the steady status of the transistor (wherein the thermal and electric balance has been reached) in a limited time period.

Figure 9:
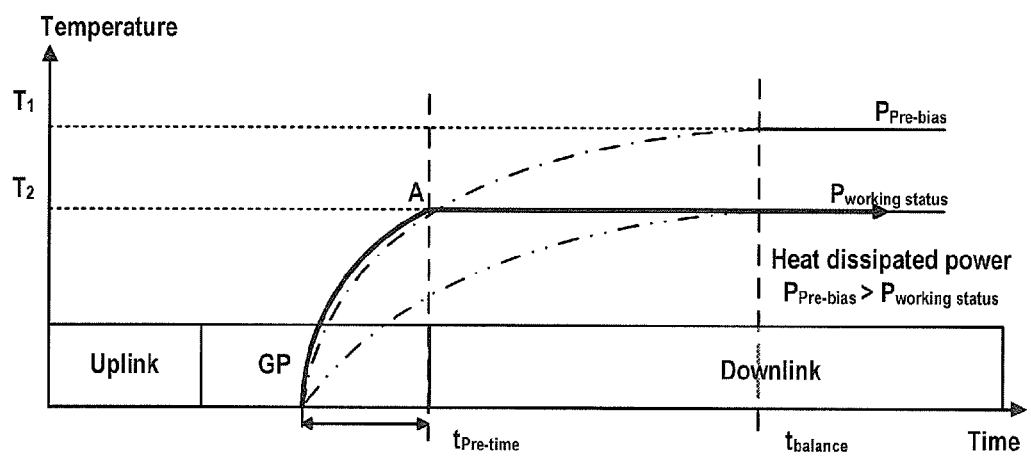
FIG. 9 schematically illustrates a temperature variation according to an embodiment of the present disclosure.

FIG. 9 schematically illustrates a temperature variation according to an embodiment of the present disclosure. In the figure, the junction temperature of the transistor will rise following the black solid curve to point A with the heat dissipated power $P_{pre-bias}$ of the pre-bias portion, and this rising period will take time $t_{pre-time}$. Then, the downlink time slot begins and the junction temperature of the transistor will follow the black straight line. Since the junction temperature may match the thermal balance under the heat dissipated power of working status as denoted by $P_{working-status}$, the junction temperature can be maintained. Thus, the transistor will operate in the steady status once the downlink time slot begins. That is to say, a temperature change of the die inside the transistor may be well compensated. However, it should be appreciated that the illustrated temperature variation is ideal and the real temperature variation may be somewhat different but it will be feasible only if the junction temperature of the transistor may rise to the temperature in steady status when the downlink time slot begins. Thus is to say, it will be preferable if the time period and the pre-bias signal may be determined such that a temperature of the transistor at beginning of the downlink time slot is substantially equal to that in a steady status.

Figure 10:
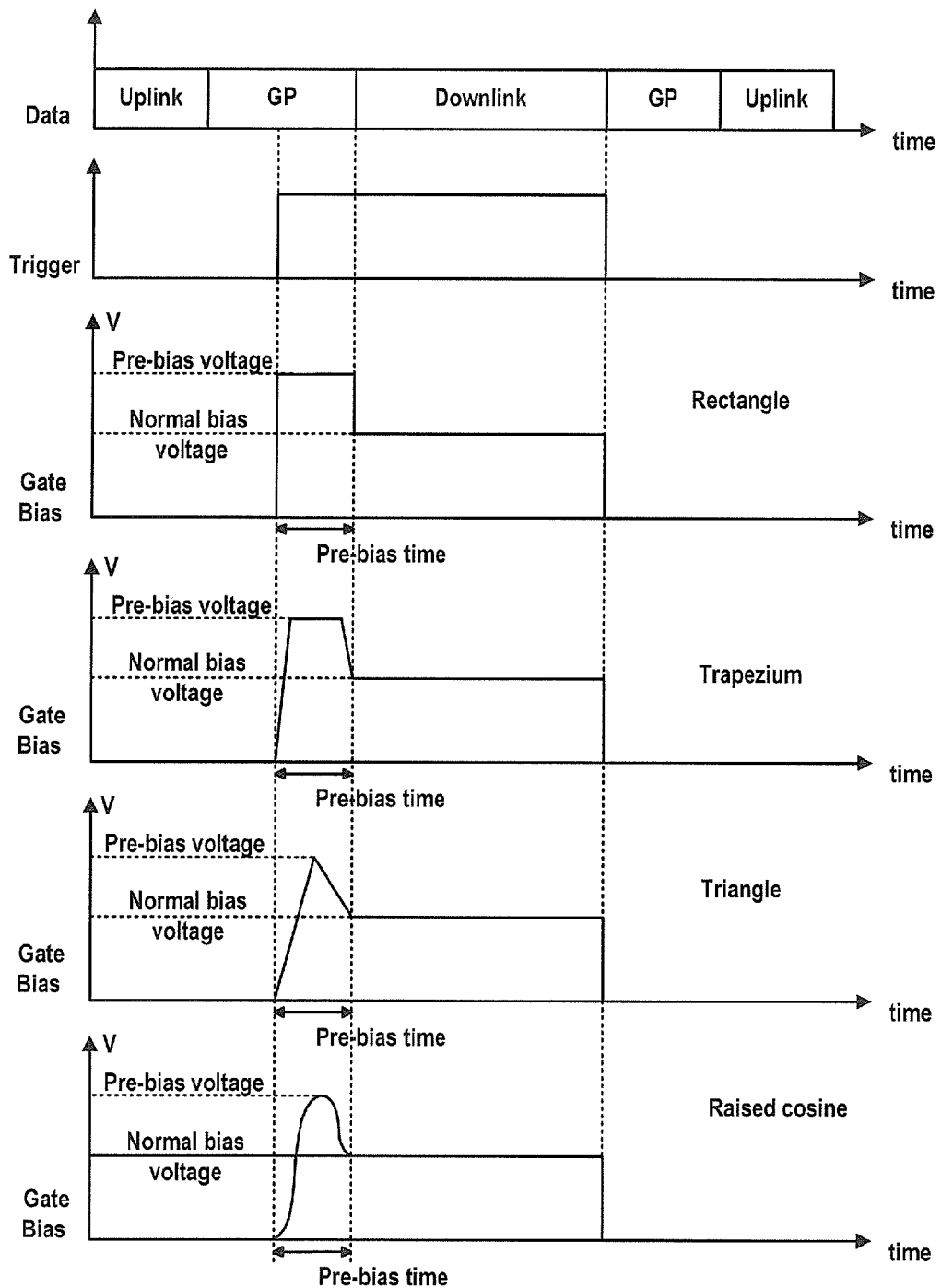
FIG. 10 schematically illustrates alternative waveforms of the pre-bias signal according to an embodiment of the present disclosure.

FIG. 10 schematically illustrates exemplary waveforms of the pre-bias signal which may be used in embodiments of the present disclosure. In the figure, there are illustrated a rectangle wave, a trapezium wave, a triangle wave, and a raised cosine wave. Additionally, it is also feasible to use any combination of these waves. However, it should be appreciated that the present disclosure is not limited thereto, and it is also possible to use any other appropriate wave. Besides, it may be also noted that the waves are illustrated for a purpose of illustration and, actually, in order to rise the junction temperature of the transistor to the temperature in the steady status, the voltage amplitude or maximum value of the pre-bias signal and the predetermined time period (i.e., the pre-bias time) may be different from waves to waves.

Beside, there is also illustrated an exemplary pre-bias trigger signal, which may be generated based on the periodic switch signal (for example, the periodic TDD uplink/downlink switch signal in the TDD system). The pre-bias signal will be provided at the rising edge of the pre-bias trigger signal, a normal pre-bias signal will be provided when the downlink time slot begins, and no any voltage will be provided when the downlink time slot terminates. However, the pre-bias trigger signal is not indispensable and as described hereinabove it is also feasible to provide the pre-bias directly based on the periodic switch signal as mentioned hereinabove.

In practice, variations of electric status and temperature of the die between quiescent status and working status may be quite different from system configurations to system configurations. The system configurations may comprise at least one of downlink/uplink subframe configuration, power level of the power amplifier, type of the transistor and etc. For example, in a LTE-TDD system, there are seven different downlink/uplink subframe configurations, i.e., configurations 0 to 6, these subframe configurations define seven different frame structure each containing different number of uplink subframes and downlink subframes. Therefore, the downlink/uplink switch time and the available time for preheat the transistor may be different for different downlink/uplink subframe configurations. Additionally, the power level of the power amplifier means a level of power at which the power amplifier is operated and a higher power level will lead to more heat dissipated. Hence, the pre-determined voltage amplitude and the pre-determined time period may be varied for different power levels of the power amplifier. For different types of the transistor, it may have different physical properties and property variations may be different.

Therefore, the pre-determined time period (i.e. pre-bias time) and the voltage amplitude of the pre-bias signal may be selected based on current system configurations. In other word, it is required to select a suitable combination of the voltage amplitude and the pre-bias time to get the best linearity improvement or nonlinearity elimination. When the system configurations are changed, the time period and the voltage amplitude of the pre-bias signal may be re-determined. The pre-bias time and the voltage amplitude of the pre-bias signal may be selected from a plurality of per-determined time periods and pre-determined voltage amplitudes of the pre-bias signal, which are determined or optimized in advance for different system configurations.

Figure 11:
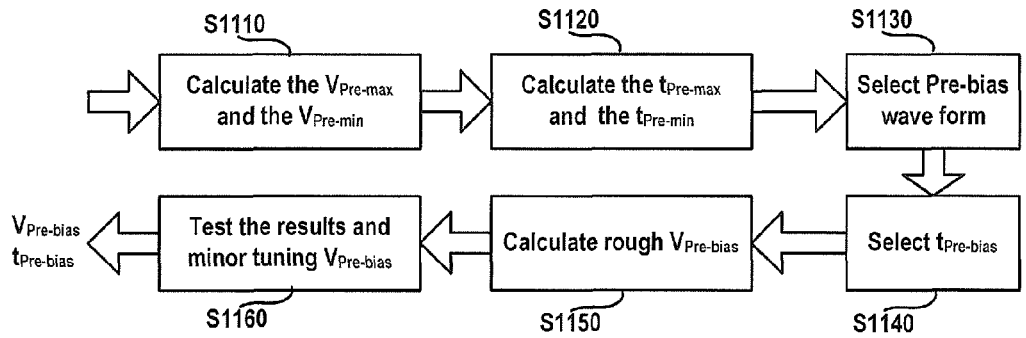
FIG. 11 schematically illustrates a flow chart of a method for pre-bias selection optimization process according to an embodiment of the present disclosure.

FIG. 11 has illustrated a flow chart of a method for pre-bias selection optimization process according to an embodiment of the present disclosure. As illustrated, the maximum and minimum voltage $V_{pre-max}$ and $V_{pre-min}$ of the pre-bias signal is calculated at step S1110. In an embodiment of the present disclosure, the minimum voltage $V_{pre-min}$ may be determined as for example the normal bias voltage, and the voltage maximum $V_{pre-max}$ may be determined as a breakdown voltage of a gate of the transistor. The breakdown voltage is one of important parameters of the transistor and it means a voltage level beyond which the transistor will be destroyed due to breakdown of the gate. It may be appreciated that, for different physical characteristics of the transistor, the breakdown voltage of the gate may be different.

Then the maximum and minimum pre-bias time, $t_{Pre-max}$ and $t_{Pre-min}$, are then calculated at Step S1120. For example, based on system designs, the maximum pre-bias time may be determined as the time length for the GP, a sum of the time length for the GP and the time length for the uplink time slot or any other predetermined time limit. It may be appreciated that for different downlink/uplink subframe configuration, the time length for the GP, the uplink time slot and the downlink time slot may be different.

Subsequently, a pre-bias waveform may be selected from the candidate waveform at step S1130. For example, a rectangle waveform may be selected. After that a pre-bias time $t_{Pre-bias}$ may be selected and a rough $V_{Pre-bias}$ may be calculated based on the selected waveform, the selected pre-bias time and the junction temperature of the transistor in steady status. Next, a test will be done to check results of these parameters and the pre-bias voltage $V_{Pre-bias}$ may be minor tuned based on the results so as to obtain better results. The tuning and the testing may be performed repeatedly until satisfactory results are achieved. In such a way, with the optimized pre-bias time and pre-bias voltage amplitude, it may achieve, at beginning of the downlink time slot, a status substantially close to the steady status.

Hereinafter, for a purpose of illustration, an exemplary embodiment for determining a range of $V_{Pre-bias}$ and $t_{pre-bias}$ will be described with reference to a rectangle wave form.

When a transistor is fed by a pre-bias voltage $V_{Pre-bias}$, it will have a quiescent current $I_{Pre-bias}$ and create a heat dissipated power $P_{Pre-bias}$ which may be represented by $P_{pre-bias} = V_{pre-bias} \cdot I_{quiescent}$. And the die temperature $T_{Pre-bias}$ to reach the thermal balance with $P_{Pre-bias}$ may be represented by $$T_{pre-bias} = R_{jc} \cdot P_{pre-bias} \quad \text{(Formula 5)}$$

Similarly, the die temperature $T_{work-status}$ to reach the thermal balance with a heat dissipated power $P_{work-status}$ may be represented by.

$$T_{work-status} = R_{jc} \cdot P_{work-status} \quad \text{(Formula 6)}$$

Additionally, from thermal theoretical analysis mentioned hereinbefore, the die temperature $T_{t_x}$ heated with $P_{pre-bias}$ at time $t_x$ may be described as below.

$$T_{t_x} = T_{pre-bias} \cdot \left[1 - \exp\left(-\frac{t_x}{\tau_j}\right)\right] \quad \text{(Formula 7)}$$

wherein $\tau_j$ denotes the time constant of the junction as given in Formula 4.

Correspondingly, the time $t_x$ to reach the die temperature $T_{tx}$ with $P_{pre\text{-}bias}$ can be denoted as $$t_x = \tau_j \cdot \ln\left(\frac{T_{pre\text{-}bias}}{T_{pre\text{-}bias} - T_{tx}}\right) \quad \text{(Formula 8)}$$

From Formula 8, the time $t_{pre\text{-}bias}$ to reach the die temperature $T_{work\text{-}status}$ with $P_{pre\text{-}bias}$ can be described as below.

$$t_{pre\text{-}bias} = \tau_j \cdot \ln\left(\frac{T_{pre\text{-}bias}}{T_{pre\text{-}bias} - T_{work\text{-}status}}\right) \quad \text{(Formula 9)}$$

$$= \tau_j \cdot \ln\left(\frac{P_{pre\text{-}bias}}{P_{pre\text{-}bias} - P_{work\text{-}status}}\right)$$

The heat dissipated power $P_{pre\text{-}bias}$ to make the die temperature reach the $T_{work\text{-}status}$ with a time period $t_{pre\text{-}bias}$ can be calculated as $$P_{Pre\text{-}bias} = \frac{P_{work\text{-}status}}{1 - \exp\left(\frac{t_{pre\text{-}bias}}{\tau_j}\right)} \quad \text{(Formula 10)}$$

For a certain $P_{work\text{-}status}$, the higher $P_{pre\text{-}bias}$ is, the smaller $t_{pre\text{-}bias}$ will be. When the heat dissipated power $P_{Pre\text{-}bias}$ equals to $P_{work\text{-}status}$, the gate bias voltage can be assumed as $V_{pre\text{-}min}$. From the formula, it can be seen that, in order to achieve $T_{work\text{-}status}$ with a time period $t_{pre\text{-}bias}$, the $P_{pre\text{-}bias}$ must be equal to or higher than $P_{work\text{-}status}$, which means that the value of $V_{Pre\text{-}bias}$ should be equal to or higher than $V_{pre\text{-}min}$.

The maximum value of $V_{Pre\text{-}bias}$, which is denoted by $V_{Pre\text{-}max}$, may be determined by the breakdown voltage of the gate of the transistor. Therefore, the value range of $V_{pre\text{-}bias}$ should be below.

$$V_{Pre\text{-}min} < V_{Pre\text{-}bias} < V_{Pre\text{-}max} \quad \text{(Formula 11)}$$

Additionally, it may be assumed that the heat dissipated power when the gate bias voltage is $V_{pre\text{-}max}$, is $P_{pre\text{-}max}$. From this formula, the minimum $t_{pre\text{-}min}$ can be obtained when the heat dissipated power $P_{pre\text{-}bias}$ equals to $P_{pre\text{-}bias}$ equals to $P_{pre\text{-}max}$. That is to say, it may obtain:

$$t_{pre\text{-}bias} >= t_{js} \cdot \ln\left(\frac{P_{pre\text{-}max}}{P_{pre\text{-}bias} - P_{work\text{-}status}}\right) \quad \text{(Formula 12)}$$

In a case that the radio system does not allow transistor to turn on in the uplink time slot, the maximum of $t_{Pre\text{-}bias}$ is the length of GP, i.e., $t_{GP}$. If the radio system can accept or can eliminate an influence when transistor is turned on in the uplink time slot, the maximum of $t_{Pre\text{-}bias}$ can be the time length of GP plus the time length of the uplink time slot. That is to say the value of the pre-bias time may satisfy:

$$t_{pre\text{-}bias} < t_{GP}; \text{ or}$$

$$t_{pre\text{-}bias} < t_{GP} + t_{uplink\text{-}slot} \quad \text{(Formula 13)}$$

In such a way, the range of the pre-bias time $t_{pre\text{-}bias}$ and the range of the pre-bias voltage $V_{pre\text{-}bias}$ may be calculated or determined.

For other waveform that the voltage amplitude $V_{pre\text{-}bias}$ is variable in pre-bias portion, similar analysis may be done but it may need to add some integral calculation since the heat dissipated power is variant.

Hereinafter, reference will be made to FIGS. 12A, 12B and 12C to describe a power amplifier system according to an embodiment of present disclosure and a device for controlling the power amplifier capable of utilizing nonlinearity correction.

Figure 2:
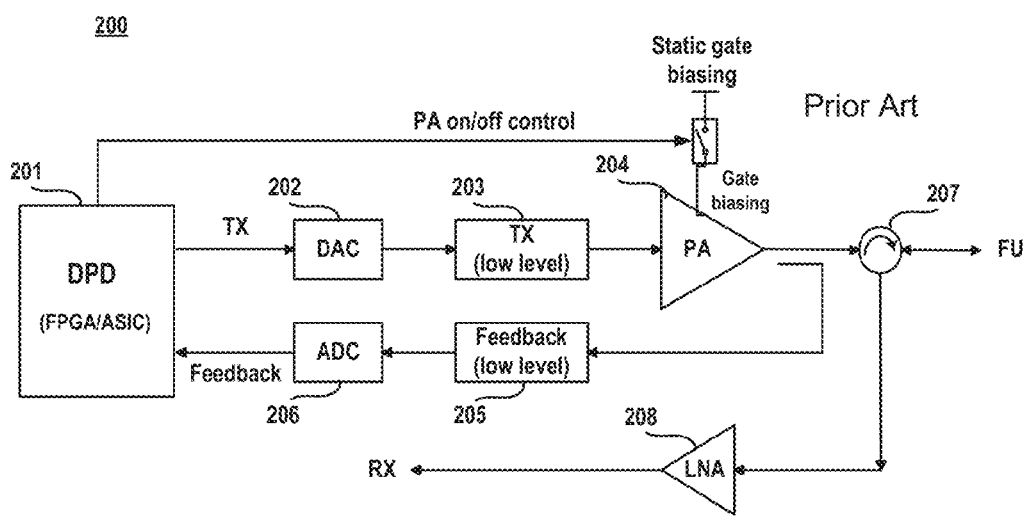
FIG. 2 schematically illustrates a typical structure of a power amplifier system for using in a TDD system in prior art.
Figure 3:
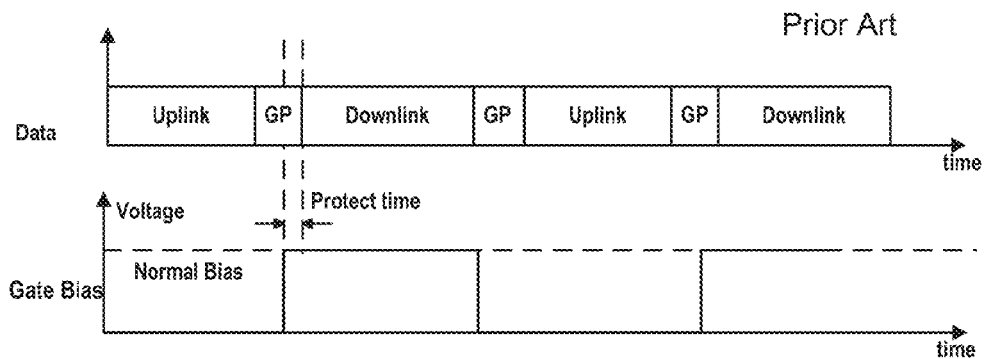
FIG. 3 schematically illustrates a bias control scheme of a power amplifier in the prior art.
Figure 12A:
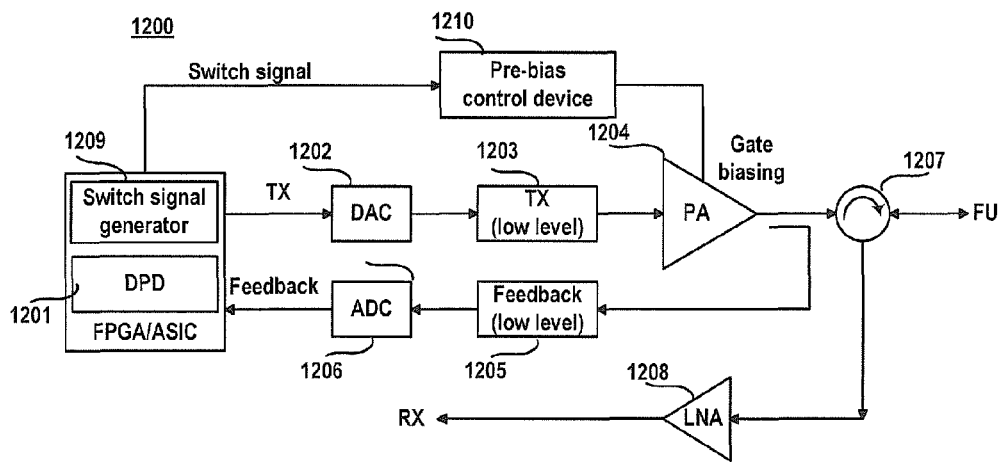
FIG. 12A schematically illustrates a diagram of a power amplifier system according to an embodiment of the present disclosure.

In FIG. 12A, there is illustrated a power amplifier system 1200 which may be used in a periodical fast switching system in time domain, for example in a TDD system. In the power amplifier system 1200, DPD module 1201, DAC 1202, TX (low level) module 1203, PA 1204, feedback (low level) module 1205, ADC 1206, circulator 1207, LNA 1208 are respectively identical to the DPD module 201, DAC 202, TX (low level) module 203, PA 204, feedback (low level) module 205, ADC 206, circulator 207, LNA 208 as illustrated in FIG. 2, and thus detailed description thereabout is omitted for a purpose of clarity. In the power amplifier system 1200, there is further comprised a per-bias control device 1210. The pre-bias control device 1210 will receive a periodic switch signal that indicates switch time of the periodical fast switching system, which may be provided for example by a switch signal generator 1209 in an FPGA/ASIC, and then based on the periodic switch signal, the pre-bias control device 1210 will provide a pre-bias signal with a pre-determined voltage amplitude to the power amplifier 1204 for a predetermined time period before each downlink time slot to preheat a transistor of the power amplifier, so as to compensate a temperature change of a die inside the transistor.

Figure 12B:
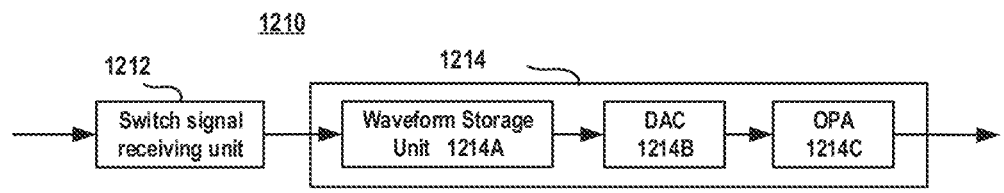
FIG. 12B schematically illustrates a block diagram of a device for controlling a power amplifier according to an embodiment of the present disclosure.

FIG. 12B schematically illustrates a block diagram of the pre-bias control device 1210 according to an embodiment of the present disclosure. As illustrated, the pre-bias control device 1210 may comprise a switching signal receiving unit 1212 and a pre-bias signal providing unit 1214.

The switching signal receiving unit 1212 may receive the periodic switch signal which indicates switch time of the periodical fast switching system. In a TDD system, the periodic switch signal may be a periodic TDD uplink/downlink switch signal. As described hereinabove, the baseband signal processing apparatus may extract the TDD synchronization information from the special subframe. Next, this TDD synchronization information may be sent to the switch signal generator (or any other suitable module) which may generate a periodic TDD uplink/downlink switch signal based on the TDD synchronization information. This periodic TDD uplink/downlink switch signal can be in any form as long as it may indicate the uplink/downlink switch time. For example, it may use a low level to indicate the uplink time slot and use a high level to indicate the downlink time slot and use a rising edge to denote the uplink/downlink switch time or vice versa.

The pre-bias signal providing unit 1214 may be configured to provide, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor. The pre-bias signal may in any form of a square wave; a trapezium wave; a triangle wave; and a cosine wave or combination thereof.

In an embodiment of the present disclosure, the pre-determined time period and the pre-determined voltage amplitude of the pre-bias signal may be selected from a plurality of pre-determined time periods and pre-determined voltage amplitudes of the pre-bias signal, which are pre-determined for different system configurations, based on current system configuration. That is to say, the time period and the voltage amplitude of the pre-bias signal may be re-determined when system configurations are changed. The system configurations may comprise at least one of: downlink/uplink subframe configuration; power level of the power amplifier; and physical characteristics of the transistor.

In an embodiment as illustrated in FIG. 12B, the pre-bias signal providing unit 1214 may comprise a wave storage unit 1214A. The wave storage unit 1214A may be configured to store a waveform of the pre-bias signal and to provide, based on the periodic switch signal, the waveform of the pre-bias signal to the transistor of the PA. Under a condition that the pre-bias signal is a digital signal, the pre-bias signal providing unit 1214 may further include a DAC converter 1214B configured to convert the pre-bias signal in a digital form into an analog form. Additionally, if the generated pre-bias signal has a voltage amplitude lower than the pre-determined voltage amplitude, then an operation amplifier 1214C may be provided so as to amplify the pre-bias signal to the predetermined voltage amplitude.

Figure 12C:
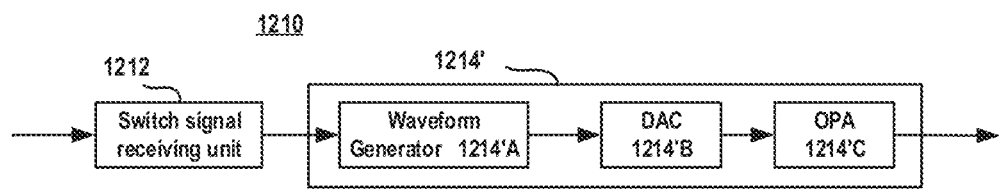
FIG. 12C schematically illustrates a block diagram of a device for controlling a power amplifier according to another embodiment of the present disclosure.

FIG. 12C also schematically illustrates a block diagram of a device for controlling a power amplifier according to another embodiment of the present disclosure. Different from the device as illustrated in FIG. 12B, the pre-bias control device 1210 may comprise a pre-bias signal providing unit 1214' which include a wave generator 1214'A configured to generate a waveform of the pre-bias signal based on the periodic switch signal. And similarly, the pre-bias signal providing unit 1214' may further include a DAC converter 1214'B configured to convert the pre-bias signal in a digital form into an analog form and an operation amplifier 1214'C configured to amplify the pre-bias signal to the predetermined voltage amplitude.

In embodiments of the present disclosure, the pre-bias signal may have a pre-determined voltage amplitude equal to or higher than a normal bias voltage and the pre-determined voltage amplitude may be lower than a breakdown voltage of a gate of the transistor. Additionally, the pre-determined time period may be equal to or less than a sum of time length of a guard period and time length of an uplink time slot, or equal to or less than the time length of the guard period. Furthermore, the time period and the pre-bias signal may be determined such that a temperature of the transistor at beginning of the downlink time slot is substantially equal to that in a steady status of the downlink time slot. Besides, the pre-bias signal may be adjusted to a normal bias voltage when each downlink time slot begins.

It should be noted that operations of the components of the pre-bias control device 1210 and the power amplifier system 1200 are substantially similar to operations of methods as described with reference to FIGS. 5 and 11. Therefore, for details about the operations of modules in the device and system, one may refer to descriptions made with reference to FIGS. 5 to 11.

Additionally, there is provided an apparatus for controlling a power amplifier capable of utilizing nonlinearity correction in a nearly steady operation status of non-linearity correction, in periodical fast switching system in time domain. Hereinafter reference will be made to FIG. 13 to describe the apparatus as provided in the present disclosure.

Figure 13:
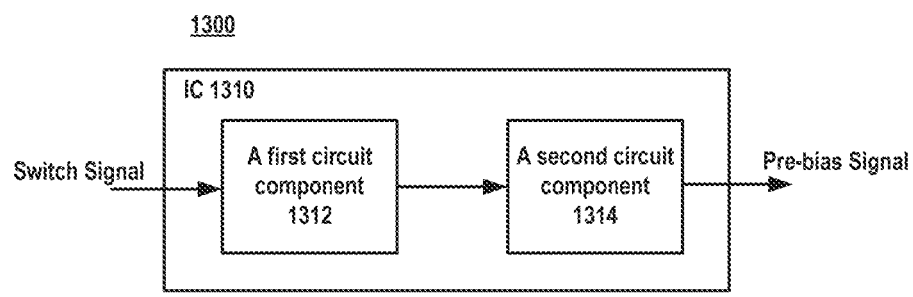
FIG. 13 schematically illustrates an apparatus for controlling a power amplifier according to an embodiment of the present disclosure.

As illustrated in FIG. 13, the apparatus 1300 may comprise an integrated circuit(IC) 1310. The IC 1310 may be configured to perform the method as described with reference to FIGS. 5 to 11. The integrated circuit 1310 may be implemented by FPGA, ASIC, or any other circuits.

In an embodiment of the present disclosure, the IC 1310 may further comprise a first circuit component 1312 and a second circuit component 1314. The first circuit component 1312 may be configured to receive a periodic switch signal indicating switch time of the periodical fast switching system. The second circuit component 1314 may be configured to provide, based on the periodic switch signal, a pre-bias signal with a pre-determined voltage amplitude to the power amplifier for a pre-determined time period before each downlink time slot to preheat a transistor of the power amplifier so as to compensate a temperature change of a die inside the transistor.

In addition, FIGS. 14 to 18 further illustrates test results according to the solution of prior art and some embodiments of the present disclosure. Parameters used in the tests are listed in Table 1.

TABLE 1

| Parameters used in the tests | |
|---|---|
| TDD subframe configuration | Uplink:Downlink = 3:7 |
| Output power of PA | 40.7 dBm |
| Signal | TDD-LTE signal |
| Peak average ratio (PAR) | 8 dB |
| Test position in time domain | 0.2 ms at the beginning of 1st downlink time slot |

Figure 14:
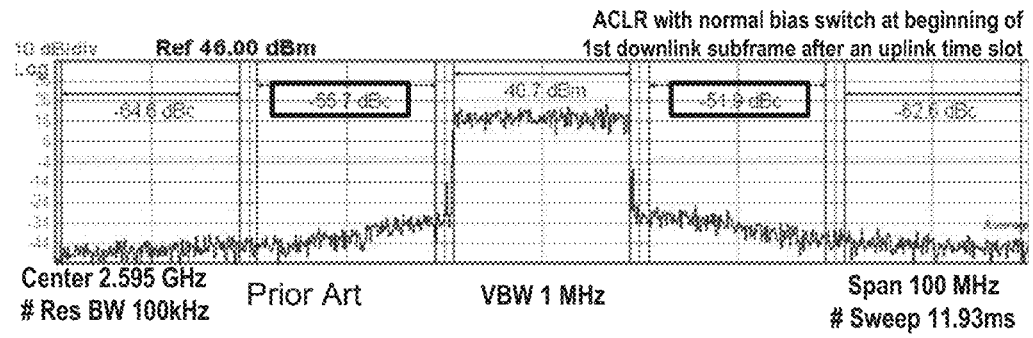
FIG. 14 schematically illustrates a test result when adopting a normal gate bias switch in the prior art.

FIG. 14 schematically illustrates a test result on ACLR with normal gate bias switch in the prior art at beginning of 1st downlink subframe after an uplink time slot. As illustrated, in a lower frequency range and a higher frequency range immediately adjacent to the signal frequency range, the ACLR values are −55.7 dBc and −51.9 dBc respectively, which are rather poor.

Figure 15:
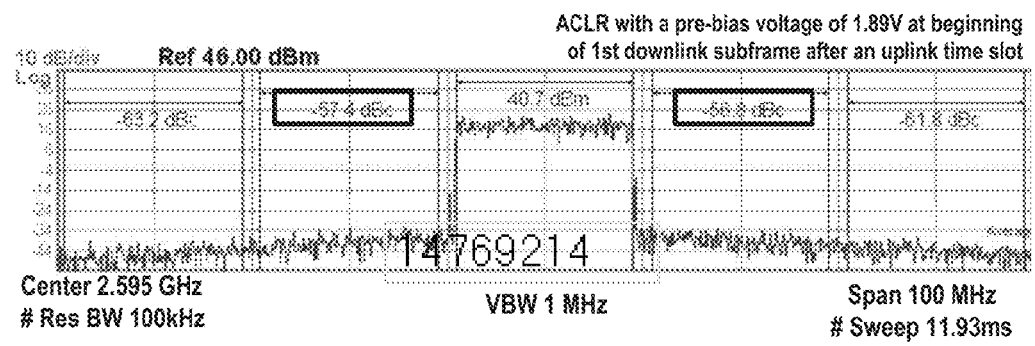
FIG. 15 schematically illustrates a test result when adopting a pre-bias scheme with a first pre-bias voltage (1.89V) equal to a normal gate bias voltage according to an embodiment of the present disclosure.

FIG. 15 schematically illustrates a test result on ACLR with a first pre-bias voltage (1.89V) equal to a normal gate bias voltage at beginning of 1st downlink subframe after an uplink time slot according to an embodiment of the present disclosure. Actually, this scheme is a special case of a solution described with reference to FIG. 7, wherein the pre-bias voltage is equal to the normal gate bias voltage and the pre-bias time is equal to a sum of time length of two guard periods and time length of an uplink time slot, that is to say, the normal bias voltage is always kept on. Similarly, the test result is related to ACLR values at beginning of 1st downlink subframe after an uplink time slot. From FIG. 15, it is clear that the ACLR values in the lower frequency range and the higher frequency range are −57.4 dBc and −56.8 dBc respectively, which has achieved about 1.7 dBc and 4.9 dBc improvement compared to the result as illustrated in FIG. 14.

Figure 16:
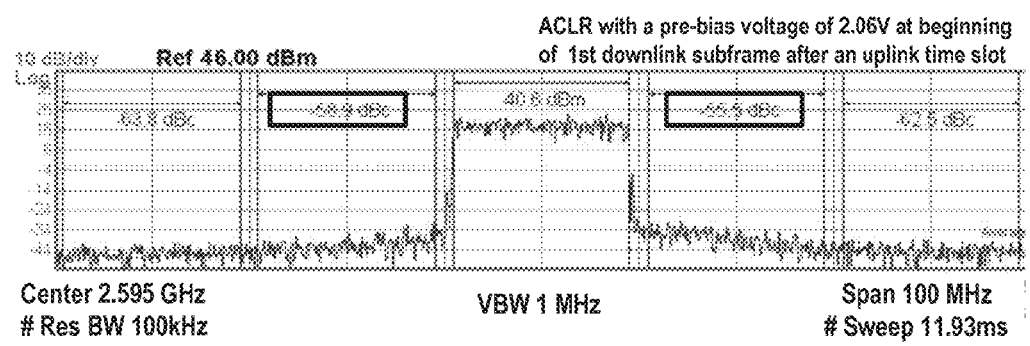
FIG. 16 schematically illustrates a test result when adopting a pre-bias scheme with a second pre-bias voltage (2.06V) higher than a normal gate bias voltage according to another embodiment of the present disclosure.

FIG. 16 schematically illustrates a test result on ACLR with a second pre-bias voltage (2.06V) higher than a normal gate bias voltage at beginning of 1st downlink subframe after an uplink time slot according to another embodiment of the present disclosure. It is clear that the ACLR values in the lower frequency range and the higher frequency range have reached to −58.9 dBc and −55.5 dBc respectively and obtained 3.2 dBc and 3.6 dBc performance gains compared to the result as illustrated in FIG. 14.

Figure 17:
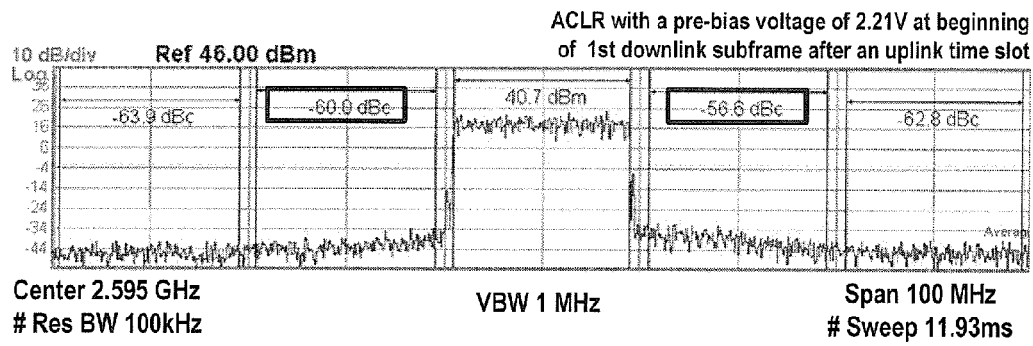
FIG. 17 schematically illustrates a test result when adopting a pre-bias scheme with a third pre-bias voltage (2.21V) higher than a normal gate bias voltage according to a further embodiment of the present disclosure.

FIG. 17 schematically illustrates a test result on ACLR with a third pre-bias voltage (2.21V) higher than a normal gate bias voltage at beginning of 1st downlink subframe after an uplink time slot according to a further embodiment of the present disclosure. According to the test result as illustrated in FIG. 17, it may be seen that the ACLR values in the lower frequency range and the higher frequency range are −60.0 dBc and −56.6 dBc respectively and about 4.3 dBc and 4.7 dBc gains have been obtained.

Figure 18:
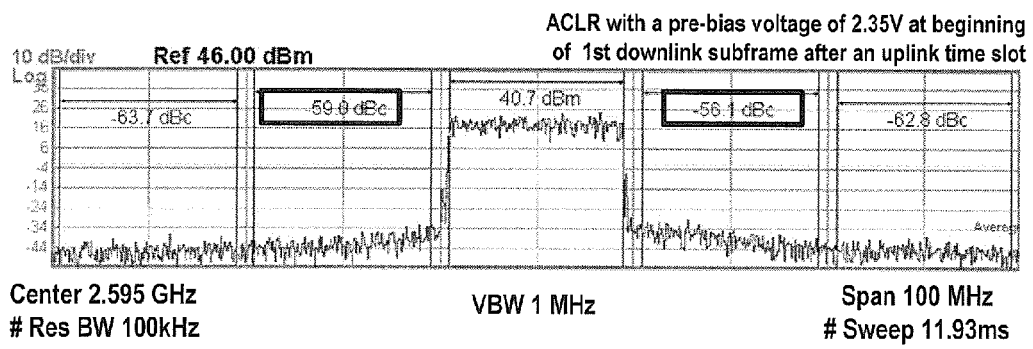
FIG. 18 schematically illustrates a test result when adopting a pre-bias scheme with a fourth pre-bias voltage (2.35V) higher than a normal gate bias voltage according to a still further embodiment of the present disclosure.

FIG. 18 schematically illustrates a test result on ACLR with a fourth pre-bias voltage (2.35V) higher than a normal gate bias voltage at beginning of 1st downlink subframe after an uplink time slot according to a further embodiment of the present disclosure. The test result as illustrated in FIG. 18 has shown that the ACLR values in the lower frequency range and the higher frequency range have reached to −59.0 dBc and −56.1 dBc respectively and about 3.3 dBc and 4.2 dBc performance gains may be obtained.

For a purpose of clarity, the following table 2 has given the list of the test results.

TABLE 2

Test results of different schemes

| Schemes | Lower frequency range | Compared to normal bias scheme | Higher frequency range | Compared to normal bias scheme |
|---|---|---|---|---|
| Normal bias scheme | −55.7 dBc | — | −51.9 dBc | — |
| Pre-bias scheme with the first pre-bias voltage (1.89 V) | −57.4 dBc | 1.7 dBc | −56.8 dBc | 4.9 dBc |
| Pre-bias scheme with a second pre-bias voltage (2.06 V) | −58.9 dBc | 3.2 dBc | −55.5 dBc | 3.6 dBc |
| Pre-bias scheme with a third pre-bias voltage (2.21 V) | −60.0 dBc | 4.3 dBc | −56.6 dBc | 4.7 dBc |
| Pre-bias scheme with a fourth pre-bias voltage (2.35 V) | −59.0 dBc | 3.3 dBc | −56.1 dBc | 4.2 dBc |

From table 2, it is clear that, in all pre-bias schemes, ACLR values have been improved compared to the normal bias scheme. However, the ACLR in the pre-bias scheme with a third pre-bias voltage (2.21V) has achieved the best performance. The reason lies in that in the pre-bias schemes with the third pre-bias voltage, the junction temperature of transistor has risen to a temperate substantially equal to that in the steady status at the beginning of the downlink time slot, while in the pre-bias schemes with the first, second and fourth pre-bias voltages, the junction temperature of transistor either has not risen as high as that in the steady status or has risen to a temperature higher than that in the steady status.

By far, embodiments of the present disclosure has been described with reference to the TDD system; however, it should be appreciated that the present invention is not limited thereto and the solution as disclosed in the present disclosure may be also applicable to other periodical fast switching system in time domain. Besides, it should be appreciated that the present invention may be applicable in any appropriate TDD system such as a LTE-TDD system, a TD-SCDMA system, and etc to benefit therefrom.

Based on the above description, the skilled in the art would appreciate that the present disclosure may be embodied in an apparatus, a method, or a computer program product. In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flowcharts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The various blocks shown in the companying drawings may be viewed as method steps, and/or as operations that result from operation of computer program code, and/or as a plurality of coupled logic circuit elements constructed to carry out the associated function(s). At least some aspects of the exemplary embodiments of the disclosures may be practiced in various components such as integrated circuit chips and modules, and that the exemplary embodiments of this disclosure may be realized in an apparatus that is embodied as an integrated circuit, FPGA or ASIC that is configurable to operate in accordance with the exemplary embodiments of the present disclosure.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for controlling a power amplifier configured to use nonlinearity correction in a nearly steady operation status of non-linearity correction, in a periodical fast switching system in a time domain that defines downlink time slots, the method comprising:
   receiving a periodic switch signal indicating a switch time of the periodical fast switching system; and
   providing, based on the periodic switch signal, a pre-bias signal with a pre-determined voltage amplitude to the power amplifier for a pre-determined time period before each downlink time slot, to preheat a transistor of the power amplifier and thereby compensate a temperature change of a die inside the transistor, wherein the pre-determined time period and the predetermined voltage amplitude of the pre-bias signal are determined such that a temperature of the transistor at beginning of each downlink time slot is substantially equal to that in a steady status of the downlink time slot.

2. The method according to claim 1, wherein the pre-determined time period and the pre-determined voltage amplitude of the pre-bias signal are selected from a plurality of pre-determined time periods and pre-determined voltage amplitudes of the pre-bias signal, which are pre-determined for different system configurations, based on a current system configuration.

3. The method according to claim 2, wherein the system configurations comprise at least one of:
   downlink/uplink subframe configuration;
   power level of the power amplifier; and
   type of the transistor.

4. The method according to claim 1, wherein providing the pre-bias signal to the power amplifier comprises providing a waveform of the pre-bias signal based on the periodic switch signal by a waveform storage circuit for storing waveforms of the pre-bias signal.

5. The method according to claim 1, wherein the providing the pre-bias signal to the power amplifier comprises generating a waveform of the pre-bias signal based on the periodic switch signal by a waveform generator.

6. The method according to claim 1, wherein the pre-determined voltage amplitude of the pre-bias signal is equal to or higher than a normal bias voltage.

7. The method according to claim 1, wherein the pre-determined voltage amplitude of the pre-bias signal is lower than a breakdown voltage of a gate of the transistor.

8. The method according to claim 1, wherein an uplink time slot is associated with each downlink time slot and is separated from the associated downlink time slot by a guard period, and wherein the pre-determined time period is equal to or less than a sum of a time length of the guard period and a time length of the uplink time slot, or equal to or less than the time length of the guard period.

9. The method according to claim 1, wherein the pre-bias signal is adjusted to a normal bias voltage when each downlink time slot begins.

10. The method according to claim 1, wherein the pre-bias signal is in a form of one or any combination of:
   a square wave;
   a trapezium wave;
   a triangle wave; and
   a cosine wave.

11. A device for controlling a power amplifier configured to use nonlinearity correction in a nearly steady operation status of non-linearity correction, in a periodical fast switching system in a time domain that defines downlink time slots, the device comprising:
   a switch signal receiving circuit, configured to receive a periodic switch signal indicating a switch time of the periodical fast switching system; and
   a pre-bias signal providing circuit, configured to provide, based on the periodic switch signal, a pre-bias signal with a pre-determined voltage amplitude to the power amplifier for a pre-determined time period before each downlink time slot to preheat a transistor of the power amplifier and thereby compensate a temperature change of a die inside the transistor, wherein the pre-determined time period and the predetermined voltage amplitude of the pre-bias signal are determined such that a temperature of the transistor at beginning of each downlink time slot is substantially equal to that in a steady status of the downlink time slot.

12. The device according to claim 11, wherein the pre-determined time period and the pre-determined voltage amplitude of the pre-bias signal are selected from a plurality of pre-determined time periods and pre-determined voltage amplitudes of the pre-bias signals, which are pre-determined for different system configurations, based on current system configurations.

13. The device according to claim 11, wherein the pre-bias signal providing circuit comprises:
   a waveform storage circuit configured to store a waveform of the pre-bias signal and to provide the waveform of the pre-bias signal based on the periodic switch signal.

14. The device according to claim 11, wherein the pre-bias signal providing circuit comprises:
   a wave generator circuit configured to generate a waveform of the pre-bias signal based on the periodic switch signal.

15. The device according to claim 11, wherein the pre-bias signal providing circuit further comprises a digital to analog converter configured to convert the pre-bias signal in a digital form into an analogy pre-bias signal.

16. The device according to claim 11, wherein the pre-bias signal providing circuit further comprises an operational amplifier for amplifying the pre-bias signal to the predetermined voltage amplitude.

17. The device according to claim 11, wherein the pre-determined voltage amplitude of the pre-bias signal is equal to or higher than a normal bias voltage.

18. The device according to claim 11, wherein the pre-determined voltage amplitude of the pre-bias signal is lower than a breakdown voltage of a gate of the transistor.

19. The device according to claim 11, wherein an uplink time slot is associated with each downlink time slot and is separated from the associated downlink time slot by a guard period, and wherein the pre-determined time period is equal to or less than a sum of a time length of the guard period and a time length of the uplink time slot, or equal to or less than the time length of the guard period.

20. The device according to claim 11, wherein the pre-bias signal is adjusted to a normal bias voltage when each downlink time slot begins.

21. A power amplifier system for using in a periodical fast switching system in a time domain that defines downlink time slots, comprising:
   a power amplifier configured to amplify a RF signal in the periodical fast switching system in time domain that defines downlink time slots and to use nonlinearity correction in a nearly steady operation status of non-linearity correction;
   a nonlinearity correction circuit configured to perform a nonlinearity correction for the power amplifier; and
   a device configured to control the power amplifier, the device comprising:
      a switch signal receiving circuit, configured to receive a periodic switch signal indicating a switch time of the periodical fast switching system; and
      a pre-bias signal providing circuit, configured to provide, based on the periodic switch signal, a pre-bias signal with a pre-determined voltage amplitude to the power amplifier for a pre-determined time period before each downlink time slot to preheat a transistor of the power amplifier and thereby compensate a temperature change of a die inside the transistor wherein the pre-determined time period and the predetermined voltage amplitude of the pre-bias signal are determined such that a temperature of the transistor at beginning of each downlink time slot is substantially equal to that in a steady status of the downlink time slot.

* * * * *